UNITARY SEMICONDUCTOR HIGH SPEED SWITCHING DEVICE
UTILIZING A BARRIER DIODE

Filed Dec. 31, 1964 2 Sheets-Sheet 1

INVENTOR
JAMES R. BAIRD

BY John G. Graham
ATTORNEY

INVENTOR
JAMES R. BAIRD

BY John G. Graham
ATTORNEY 3,463,975

UNITARY SEMICONDUCTOR HIGH SPEED SWITCHING DEVICE UTILIZING A BARRIER DIODE

James Robert Biard, Richardson, Tex., assignor to Texas Instruments Incorporated, Dallas, Tex., a corporation of Delaware Filed Dec. 31, 1964, Ser. No. 422,774
Int. Cl. H01l *11/00, 15/00*
U.S. Cl. 317—235 6 Claims

ABSTRACT OF THE DISCLOSURE

Disclosed is a semiconductor device which comprises a transistor having a metal semiconductor barrier diode shunting the base and the collector junction, the diode having a lower forward voltage drop than the P-N junction between the base and the collector.

This invention relates to semiconductor devices, and more particularly to integrated semiconductor circuit arrangements adapted for operation at high switching speeds.

In electronic circuitry of the type used to perform logic operations in digital computing systems one of the main factors influencing the design is the switching speed, i.e., the time required to change the conductive state of the functional elements of the circuitry. When transistors are used as the active elements in such circuits, the primary limiting factor with respect to the switching speed is the time required to turn on and turn off the collector current in these semiconductor devices. This invention is primarily concerned with this speed factor.

The switching speed of transistors can be optimized by judicious selection of the device geometry, i.e., the size and shape of the active regions and junctions, and of the electrical characteristics of the regions of the device, particularly the resistivity, impurity gradient, carrier lifetime, etc., as well as selection of the semiconductor material itself. Once the speed of the device is increased to the maximum permitted by materials technology and production feasibility, the operating speed of the system in which such devices are used can be greatly affected by the circuitry surrounding the devices.

The period of time required to turn on a transistor, referred to as "rise time," can be minimized by driving the base of the device with fairly large electrical signals. Unfortunately, this large input tends to drive the transistor into a saturated condition, to the detriment of another factor affecting the switching speed, this being the "storage time." When the transistor is saturated, the collector-base junction is forward biased and the base region stores a large concentration of minority carriers. Before the transistor can be considered turned off, the collector-base junction has to be returned to the usual reverse bias state, and to do this the stored carriers must be swept out of the base region. The time period required to do this, referred to as the storage time, is often the primary limiting factor on the switching speed. Thus, the operating speed of the logic system is often a compromise between using sufficient driving voltage to obtain a fairly short rise time for the transistors, but yet keeping the devices out of saturation to avoid unduly long storage time.

Several techniques have been developed for increasing the switching speed of such circuits, including the use of resistance-capacitance coupling so that voltage spikes appear on the transistor base to turn on and turn off the unit while the hold-on voltage is much lower, holding the transistor out of saturation. The disadvantages of R-C coupling are the necessity of additional components and the inherent delay introduced by the R-C combination itself.

Another technique which has been quite successful is the use of a diode in a transistor switching circuit shunting the collector-base junction and biased or otherwise adapted to conduct in the forward direction at a slightly lower voltage than the collector-base diode. This prevents the collector-base from becoming forward biased, a condition necessary for saturation, and therefore avoids storage of a high concentration of carriers in the base. With this arrangement, the base can be driven with large signals, but yet storage time is quite short. The forward voltage necessary for conduction of the shunt diode may be reduced below that of the collector-base junction by adding a low level voltage source in series with the diode, but this is inconvenient in some circuits, especially integrated semiconductor networks. Another technique is to use a different material for the diode, i.e., use a germanium diode with a silicon transistor, but again this is impossible in a monolithic integrated circuit where all of the components are formed in a unitary body of semiconductor material.

It is the principal object of this invention to provide improved semiconductor circuits of the type suitable for use at high operating speeds. Another object is to provide semiconductor elements especially suited for use in logic circuits in high speed digital systems. A further object is to provide an integrated semiconductor structure containing a transistor which can be driven with high level base input voltages without being operated in the saturation mode.

In accordance with this invention, a P-N junction in a semiconductor device is prevented from becoming forward biased by shunting the junction with a metal-semiconductor diode, commonly referred to as a Schottky barrier diode. Particularly, the collector-base junction of a transistor has a metal-semiconductor diode connected across it and poled for conduction in the forward direction the same way as the collector-base. The metal-semiconductor diode may be fabricated upon the same semiconductor wafer as the transistor, or each transistor in an integrated semiconductor circuit may have one of the shunt diodes connected therewith on the monolithic semiconductor bar. A unitary semiconductor element is thereby provided which can be operated at high switching speeds.

The novel features believed characteristic of this invention are set forth in the appended claims. The invention itself however, as well as other objects and advantages thereof, may best be understood by reference to the following detailed description of illustrative embodiments, when read in conjunction with the accompanying drawings wherein:

Figures 1, 2, 3, 4:
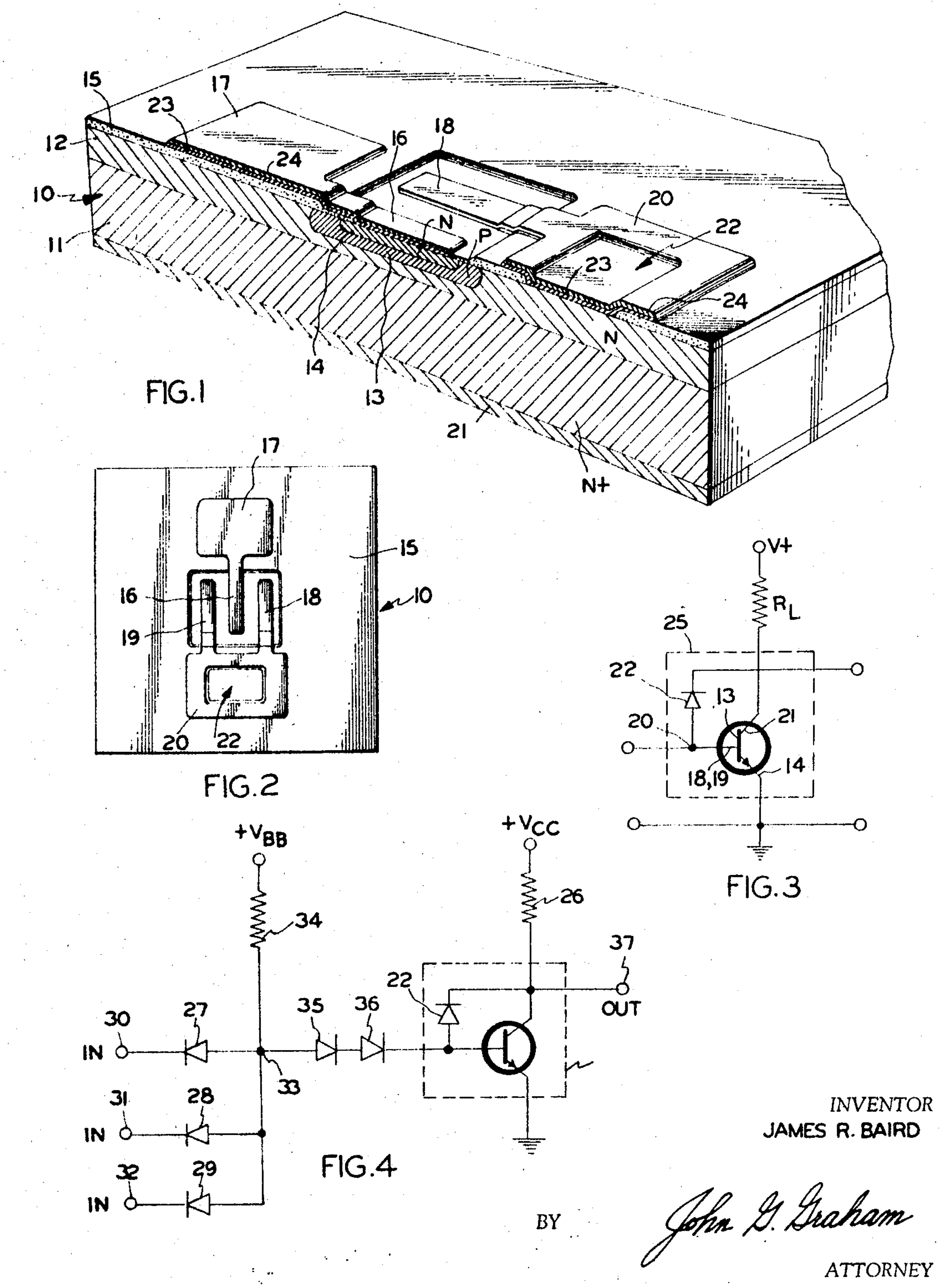
FIGURE 1 is a pictorial view in section of a preferred embodiment of the invention.
FIGURE 2 is a plan view of the device of FIGURE 1.
FIGURE 3 is a schematic diagram of an electrical circuit utilizing the device of FIGURES 1 and 2.
FIGURE 4 is a schematic diagram of a digital logic circuit utilizing the unitary transistor-diode device of this invention.
Figure 5A:
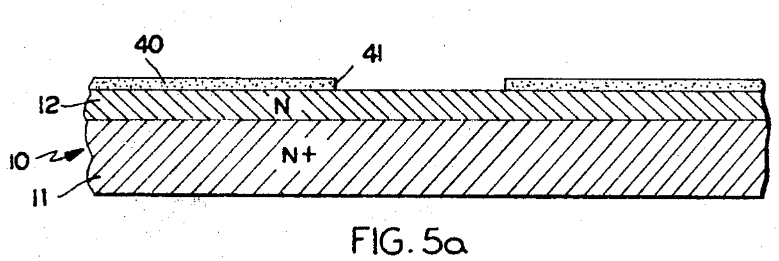
Figure 5B:
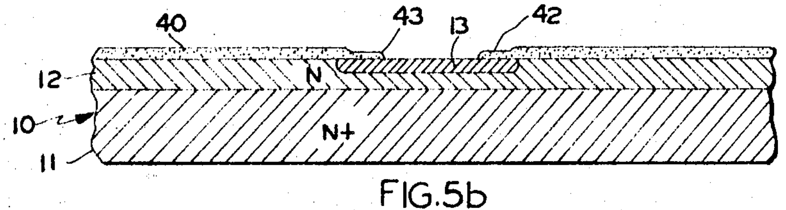
Figure 5C:
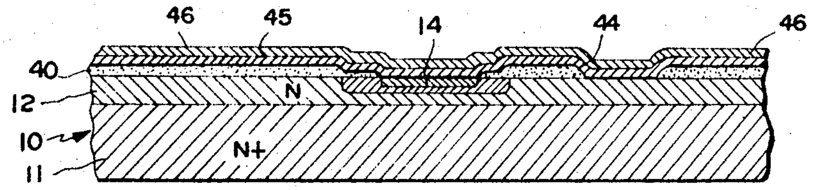
Figure 7:
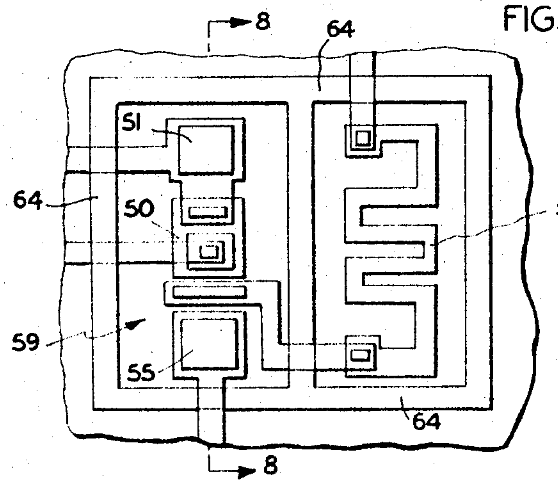
Figure 6:
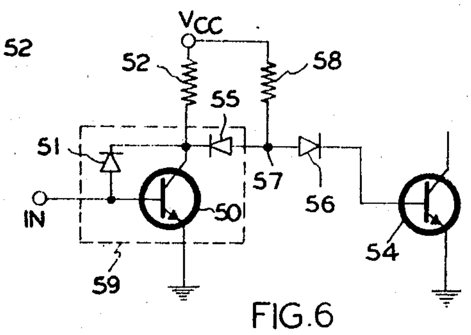

FIGURES *5a–5c* are elevational views of the device of FIGURES 1 and 2 at successive stages of manufacture;

FIGURE 6 is a schematic diagram of another embodiment of the invention;

FIGURE 7 is a top plan view of the circuit shown in FIGURE 6; and

Figure 8:
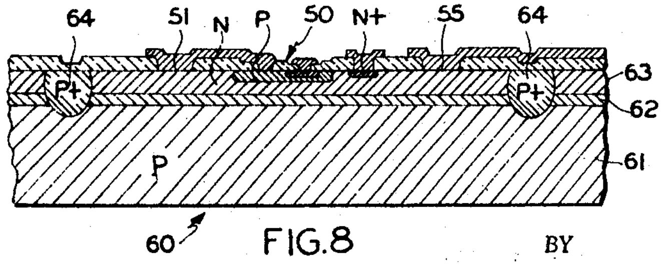

FIGURE 8 is an elevational view of the circuit shown in FIGURE 6.

With reference to FIGURE 1, a semiconductor device is illustrated which comprises an N-P-N epitaxial transistor of the planar configuration with expanded contacts. The transistor includes a metal-semiconductor diode integral therewith and shunting the collector and base regions in accordance with this invention. In this illustrative embodiment the device comprises a silicon wafer 10 which includes a substrate 11 heavily doped with donor impurities and an epitaxially grown layer 12 more lightly doped N-type. A base region 13 is formed in the epitaxial layer by selective diffusion of acceptor impurities, and an emitter region 14 is defined within the base region by a selective N-type diffusion. A silicon oxide coating 15 covers the top surface of the wafer, except where contacts are made, and it will be noted that this oxide coating is in a stepped configuration due to the oxide removal, deposition and diffusion steps performed in making the base and emitter regions using silicon oxide masking. An emitter contact is provided on the transistor wafer by a metal strip 16 which makes non-rectifying connection to the silicon surface over the emitter region 14. Due to the extreme small size of the active regions of the transistor, the emitter region 14 being only perhaps one mil long and one or two tenths of a mil wide, expanded contacts are provided. The emitter contact 16 extends out over the oxide to form an enlarged bonding pad 17 which is large enough for a one mil diameter wire to be compression bonded thereto. In like manner, a base connection is provided by a pair of metal strips 18 and 19 making non-rectifying contact to the base region 13 in openings formed in the oxide layer. The base contact is also expanded out over the oxide coating to form an enlarged bonding pad 20, although it will be noted that the contact metal of the pad 20 also extends down to engage the silicon surface, forming a metal-semiconductor diode as will be explained below. Contact is made to the collector region of the transistor, which comprises the substrate 11 and the epitaxial layer 12, by a metal member 21 on the lower surface of the wafer. Actually, this connection is made by soldering the wafer down to a metallic header or to a metallized area on a ceramic packaging arrangement. Small gold wires would ordinarily be bonded to the emitter and base bonding pads 17 and 20 and connected to feed-through electrodes in an hermetically sealed package.

A metal-semiconductor diode 22 is provided on the top surface of the collector region of the transistor of FIGURES 1 and 2 by the metallic pad 20 which engages the surface of the silicon in an opening formed in the oxide layer 15. The strip 18 extending from the metal pad 20 over the oxide makes ohmic connection to the base region 13, and so the diode 22 formed at the interface between the metal area 20 and the silicon is shunting the base and collector of the transistor as illustrated in FIGURE 3.

It is important to note that the same metal film makes non-rectifying contacts to the emitter region at the strip 16 and to the base region at the strips 18 and 19, but yet makes rectifying connection to the collector region 12 beneath the pad 20. This is possible when the contacts are composed of a metal which, at the temperatures used to apply the metal or to which the device is subjected in subsequent processing, does not alloy with the silicon surface. Molybdenum is an example of a suitable metal. Gold may also be used in direct contact with the silicon surface, although with this metal the temperature must be kept below 377° C., the gold-silicon eutectic point.

In the preferred embodiment, the contacts are composed of two layers of metal, a lowermost layer 23 of molybdenum and a top layer 24 of gold. The molybdenum is preferable because it does not alloy with silicon at temperatures ordinarily used in manufacture, it adheres resonably well to silicon and silicon dioxide, it does not alloy with and is not penetrated by gold, and it can be selectively applied with the evaporation and photoresist masking techniques ordinarily used in semiconductor manufacture. Gold is ideal for the top layer because it is highly conductive so that series resistance is not introduced, it adheres to molybdenum, and it can be easily bonded to with the commonly-used small gold wires without the problem of formation of $AuAl_2$ such as is present when aluminum is used as a contact metal. For high impurity concentrations at the silicon surface, above about $10^{20}$ atoms/cc., the molybdenum will make low resistance ohmic contact. This high surface concentration is ordinarily present at least at the surface of the base and emitter regions 13 and 14 of the transistor described above due to the diffusion techniques used in manufacture, and so non-rectifying connection is made by the strips 16, 18 and 19. The collector region 12 is of low concentration epitaxial material, however, and rectifying connection is made by the same metal, molybdenum, under the pad 20, even though this part of the layer 23 is formed identically with the other parts.

An example of a circuit in which the device of this invention is utilized to advantage is illustrated in FIGURE 4. This is a gate circuit with three inputs, being of the so-called "diode transistor logic" form. The unitary transistor-diode combination 25 of FIGURES 1 and 2 is used as an inverting amplifier, the emitter 17 being grounded and the collector being connected through a load resistor 26 to a positive supply $+V_{cc}$. A diode gate portion of the circuit includes three P-N junction diodes 27, 28 and 29 connected separately to three logic inputs 30, 31 and 32. The input diodes have a common anode portion 33 which is connected through a resistor 34 to a bias supply $+V_{BB}$ and further connected through two diodes 35 and 36 to the base of the inverting transistor. The diodes 27–29 preferably have a fast recovery time whereas the diodes 35 and 36 should have a slow recovery time. In operation, this circuit functions as an inverting AND gate or "NAND" gate, if a positive voltage is assumed to be a "1" in the binary system. With a 1 present at each of the inputs 30–32 the diodes 27–29 will be back biased and the combination of the supply $+V_{BB}$ and the resistor 34, acting as a current source, will apply base current to the device 25, turning it on. This will produce a low voltage, or a low current, at an output terminal 37. On the other hand, if any one of the inputs 30–32 has a "0" or low voltage thereon, the associated one of the diodes 27–29 will conduct the current from the resistor 34, the base current for the device 25 will be essentially zero, and the voltage at or current out of, the output 37 will be high. Since the output 37 of one of these circuits would ordinarily drive an input 30–32 of a like circuit, the two diodes 35 and 36 are needed in series to insure that the current from the resistor 34 will flow out of an input terminal 30–32 and through the collector-emitter of a turned-on transistor in a preceding circuit rather than into the base of the unit 25, the forward drop across the two diodes being of course twice that of a single input diode if all diodes are of the same material. The input diodes may be also of the metal-semiconductor type as set forth below.

Some of the advantageous features of the use of the invention may be appreciated by consideration of the circuit of FIGURE 3. The foremost of course is the decrease in the switching time of the circuit, permitting operation of the digital system at greater speeds. This decrease is due to the elimination of minority carrier storage in the base of the transistor 25. As explained above, the base can be driven with a large signal from the supply $+V_{BB}$ to minimize the delay time and rise time, but the transistor cannot be saturated because the collector-base junction will not support a forward voltage, the diode 22 tending to conduct at a lower voltage. The recovery time of the diode 22 is virtually non-existent since it is a majority carrier device. Another important advantage in the circuit of FIGURE 4 is the fact that the tolerance for the resistor 34 is substantially relaxed. Without the diode 22 the resistor 34 would have to be within a rather narrow range because if its value is too low it would permit the transistor to go into saturation, while if too high the base would not be driven hard enough. With the diode 22, however, the lower limit is considerably relaxed since the transistor cannot be saturated and excess current will be merely shunted through the diode and thence through the collector and emitter of the transistor to ground. This feature is particularly advantageous when the circuit of FIGURE 4 is fabricated in integrated circuit form since the resistors must be formed by diffused regions in semiconductor material, a technique which does not lend itself to manufacture of high precision resistors. It will be noted that the resistor 26 in this circuit does not have stringent tolerance limits, and so relaxation of the tolerance requirements for the resistor 34 contributes substantially to the ease of fabrication of the circuit in integrated form. Another feature of the use of the diode 22 in the circuit of FIGURE 4 is that a better gain-bandwidth product is provided for the amplifier function because the transistor operates in a linear region when in the on condition.

A method of making the device of FIGURES 1–3 will now be described. The starting material is a slice of silicon of which the wafer 10 is at this point merely a very small undivided segment. The slice may be about one inch in diameter and ten mils thick, whereas the wafer 10 is only about thirty mils square and perhaps four mils thick when the slice is lapped down on the back and then broken into hundreds of the individual wafers. The slice comprises a substrate 11 of high concentration, low resistance N-type silicon with the epitaxial layer 12 having been formed thereon with a resistivity of perhaps 4 Ω-cm. The particular resistivity used for the epitaxial layer is rather important, it being necessary that the donor concentration be low enough so that the molybdenum makes rectifying contact thereto instead of ohmic, creating a metal-semiconductor diode, but yet the resistivity should not be too high because series resistance between the diode and the area actually functioning as the collector would be too great. Thus, the resistivity of the epitaxial layer is a compromise between these factors.

A silicon oxide coating is formed on the epitaxial layer of the starting material, and it is preferable that this initial oxide coating be formed by a low temperature deposition technique rather than by the more conventional thermal method. The growth of thermal oxide on silicon is done at perhaps 1200° C. in oxygen for lengthy periods of upwards of an hour, during which time donors from the substrate 11 diffuse into the more lightly doped epitaxial region 12, varying the position of the N+ to N interface. More important however, the growth of thermal oxide apparently tends to cause a high impurity concentration at the silicon surface beneath the oxide coating. Thus, even though the epitaxial layer 12 is originally uniformly doped, after growth of a thermal oxide the donor concentration at the surface would be greater than that in the interior of the epitaxial layer. This high surface concentration is undesirable for the reason discussed above. This problem is avoided by forming the initial oxide coating by a method such as low temperature cracking of ethylorthosilane. The silicon slices are placed in a boat within a tube furnace which is maintained at perhaps 500° C. while vapors of the silane and oxygen are introduced. Oxygen is bubbled through liquid ethylorthosilane and thence into the furnace. Additional oxygen may be added to the stream to promote oxide formation at low temperature. With this arrangement, a silicon oxide layer 40 is deposited over the epitaxial layer 12 as seen in FIGURE *5a*. An opening 41 is made in the layer 40 by photoresist techniques, and a P-type diffusion is performed using boron as the impurity, creating the base region 13. A thin layer 42 of thermal oxide forms over the base region during the deposition process for this base diffusion. An opening 43 is made in the oxide layer 42 by photoresist masking and etching, then an N-type diffusion is performed to define the emitter region. Openings are now formed in the oxide coating by photoresist masking and etching for the purpose of making ohmic contacts to the heavily doped material where the emitter and base contact stripes 16, 18 and 19 are to be applied, while at the same time an opening 44 is defined over the lightly doped epitaxial material to accommodate the diode 22. After suitable surface cleaning, a film 45 of molybdenum of perhaps 10$\mu$ thickness is deposited on the entire top surface by evaporation, then a film 46 of gold is likewise deposited onto the molybdenum. The desired pattern of contacts is then defined by photoresist masking and the excess metal is removed by etching to leave the metallized areas as seen in FIGURES 1 and 2.

In another embodiment of the invention, a second metal-semiconductor diode is used along with the device described above to provide proper voltage levels in logic circuits. With reference to FIGURE 6, a portion of a circuit is shown including a first transistor 50 having a Schottky barrier device 51 connected from base to collector. The emitter of this transistor is grounded, while the collector is connected to a positive supply $+V_{cc}$ through a load resistor 52, the input being connected to the base. When the transistor 50 is turned on by a large base input. the collector voltage is the sum of the base-emitter forward voltage drop, $V_{be}$, and the forward drop across the Schottky barrier device, $V_s$. Since $V_s<V_{be}$, this collector voltage will be a small positive voltage. In contrast, it should be noted that without the device 51 the collector voltage would be substantially zero for a saturated condition of the transistor 50. The collector of the first transistor 50 is coupled to the base of a second transistor 54 by means of a diode coupling arrangement including a pair of diodes 55 and 56 poled in opposite directions with the junction 57 of the anodes being connected to the voltage supply through a large resistor 58 which acts as a constant current source. When the transistor 50 is on, all of the current from the resistor 58 will flow through the diode 55, and the voltage at the point 57 should be less than the sum of the forward voltages of the diode 56 and the base-emitter junction of the transistor 54 to insure that the second transistor will remain cut off. However, the collector voltage of the transistor will be significantly greater than zero in the on condition as set forth above, and so if the diode 55 is a P-N junction device the voltage at the point 57 is undesirably high. Accordingly, the diode 55 is a metal-semiconductor barrier device, just like the diode 51, so that its forward voltage will be less than $V_{be}$, and so that the voltage at the point 57 will be significantly less than $2V_{be}$ or that required to turn on the transistor 54. The transistor 50 along with the barrier diodes 51 and 55 are thus made as a unitary device 59.

With reference to FIGURES 7 and 8, the unitary device 59 of FIGURE 6 is shown embodied in integrated circuit form along with the load resistor 52. This is merely a fragmentary view of the integrated circuit because ordinarily a large number of components and logic functions would be formed in the same semiconductor wafer 60. This wafer 60 includes a P-type substrate 61, a heavily doped N+ epitaxial layer 62, and a lightly doped epitaxial layer 63. The base and emitter of the transistor 50 are formed in the layer 63 by a diffusion, and the resistor 52 is likewise formed by a P-type diffused region. The transistor 50 and the resistor 52 are isolated from one another and from other devices on the wafer by P+ isolation diffusion strips 64. Both of the diodes 51 and 55 are formed adjacent the transistor 50 so that the anodes of the two diodes are common with the transistor collector. The cathode of the diode 51 is connected to the transistor base by a metal strip, while the cathode of the diode 55 is coupled by a metal strip to the remainder of the circuit, not shown. The conductive strips are isolated from the wafer 60, except where contact is desired, by an insulating coating 65, typically silicon oxide. As above, the material used for the contacts, interconnections, and metal-semiconductor barrier diodes is a metal which does not alloy with the semiconductor material at the temperatures used in fabrication. Preferably, a bottom layer of molybdenum would be used with an overlay of gold. Other metals would be suitable, such as vanadium with an overlay of gold or silver, or gold alone if temperatures are maintained low in manufacturing. It is important in all embodiments of this invention that the metal selected forms a metal-semiconductor diode having a forward voltage which is lower than that of a P-N junction in the semiconductor wafer.

While this invention has been described with reference to specific embodiments, it is understood that this description is not to be constructed in a limiting sense. Various modifications of the disclosed embodiments, as well as other embodiments of the invention, will be apparent to persons skilled in the art. Accordingly, it is contemplated that the appended claims will cover any such modifications or embodiments as fall within the true scope of the invention.

What is claimed is:

1. A device comprising a semiconductor body having emitter, base and collector regions of a transistor with collector-base and base-emitter P-N junctions, and metal-semiconductor rectifying barrier means formed on a surface of said body and connected across said collector-base P-N junction in the same direction as said collector-base P-N junction.

2. A device according to claim 1 including an insulating layer on said surface having openings therein over said base and collector regions and said barrier means comprises a metal layer on said insulating layer extending into said openings for connection to said base and collector regions.

3. A device according to claim 2 wherein said insulating layer defines a further opening over said emitter region, and includes a metal contact comprised of the same metal as said metal layer on said insulating layer and extending into said further opening for connection to said emitter region.

4. A device according to claim 3 wherein said metal layer is comprised of molybdenum.

5. A device comprising a semiconductor body having an N-type emitter, P-type base and N-type collector of a transistor with collector-base and base-emitter P-N junctions extending to one surface of said body, and a metal-semiconductor rectifying barrier means for increasing the switching speed of said transistor formed on said one surface of said body and connected across said collector-base P-N junction, said barrier means comprising a metal layer in rectifying contact with said collector and in ohmic contact with said base.

6. An integrated circuit device comprising a substance having a plurality of semiconductor regions adjacent one surface thereof and electrically isolated from one another through said substrate, each semiconductor region having an electrical circuit element formed therein, at least one circuit element comprising a transistor having collector, base and emitter zones with collector-base and base emitter P-N junctions, and metal-semiconductor rectifying barrier means for increasing the switching speed of said formed on the semiconductor region having said transistor connected across said collector-base P-N junction of said transistor in the same direction as said collector-base P-N junction.

References Cited

UNITED STATES PATENTS

| | | | |
|---|---|---|---|
| 2,798,189 | 7/1957 | Alexander | 317—235 |
| 3,105,159 | 9/1963 | Ditkofsky | 307—88.5 |
| 3,158,788 | 11/1964 | Last | 317—101 |
| 3,194,977 | 7/1965 | Anzalone et al. | 307—88.5 |
| 3,199,002 | 8/1965 | Martin | 317—234 |
| 3,209,279 | 9/1965 | Kambouris | 331—78 |
| 3,244,949 | 4/1966 | Hilbibu | 317—235 |
| 3,158,746 | 11/1964 | Lehovec | 250—199 |
| 3,210,620 | 10/1965 | Lin | 317—234 |
| 3,290,127 | 12/1966 | Kahng et al. | 29—195 |
| 3,319,140 | 5/1967 | Toussaint et al. | 317—235 |
| 3,349,297 | 10/1967 | Crowell et al. | 317—234 |
| 3,280,391 | 10/1966 | Bittmann et al. | 317—234 |
| 3,397,450 | 8/1968 | Bittmann et al. | 29—578 |

JOHN W. HUCKETT, Primary Examiner

R. SANDLER, Assistant Examiner

U.S. Cl. X.R.

307—317